US009158003B2

(12) United States Patent
Kim et al.

(10) Patent No.: US 9,158,003 B2
(45) Date of Patent: Oct. 13, 2015

(54) MULTI-ENERGY RADIATION DETECTORS AND METHODS OF MANUFACTURING THE SAME

(71) Applicant: Samsung Electronics Co., Ltd., Suwon-Si, Gyeonggi-Do (KR)

(72) Inventors: Sun-il Kim, Osan-si (KR); Jae-chul Park, Suwon-si (KR); Sang-wook Kim, Yongin-si (KR); Chang-jung Kim, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 82 days.

(21) Appl. No.: 13/728,013

(22) Filed: Dec. 27, 2012

(65) Prior Publication Data
US 2013/0168563 A1 Jul. 4, 2013

(30) Foreign Application Priority Data
Dec. 28, 2011 (KR) .................. 10 2011 0145018

(51) Int. Cl.
| | | |
|---|---|---|
| *G01T 1/16* | (2006.01) | |
| *H01L 31/18* | (2006.01) | |
| *G01T 1/24* | (2006.01) | |
| *H01L 31/0352* | (2006.01) | |
| *H01L 31/119* | (2006.01) | |
| *H01L 27/146* | (2006.01) | |

(52) U.S. Cl.
CPC . *G01T 1/16* (2013.01); *G01T 1/243* (2013.01); *H01L 27/14676* (2013.01); *H01L 31/035281* (2013.01); *H01L 31/119* (2013.01); *H01L 31/18* (2013.01); *Y02E 10/50* (2013.01)

(58) Field of Classification Search
CPC .................................. G01T 1/16; H01L 31/18
USPC ...................... 250/370.06; 378/98.9
See application file for complete search history.

(56) References Cited

U.S. PATENT DOCUMENTS

2002/0084419 A1 * 7/2002 Choo et al. ............... 250/370.01
(Continued)

FOREIGN PATENT DOCUMENTS

| EP | 69679 A | * | 1/1983 |
|---|---|---|---|
| EP | 69679 A2 | * | 1/1983 |

(Continued)

*Primary Examiner* — David Porta
*Assistant Examiner* — Abra Fein
(74) *Attorney, Agent, or Firm* — Harness, Dickey & Pierce, PLC (57) ABSTRACT

A multi-energy radiation detector may include an array substrate including a plurality of unit circuits, and/or a photoelectric conversion layer on the array substrate. The photoelectric conversion layer may include a plurality of regions having thicknesses different from each other. A method of manufacturing a multi-energy radiation detector may include forming gate and first electrodes by forming and patterning a first metal layer on a substrate; forming an insulating layer on the gate and first electrodes; forming a channel layer by forming and patterning a semiconductor layer on the insulating layer; forming source, drain, and second electrodes by forming and patterning a second metal layer on the channel layer; forming a passivation layer to cover the source, drain, and second electrodes; forming a first photoelectric conversion layer on the passivation layer; and/or forming a second photoelectric conversion layer on part of the first photoelectric conversion layer.

25 Claims, 5 Drawing Sheets

(56) References Cited

U.S. PATENT DOCUMENTS

2005/0253079 A1* 11/2005 Hoffman .................. 250/370.13
2009/0078305 A1* 3/2009 Nishiwaki .................... 136/249
2011/0061715 A1* 3/2011 Fujibayashi et al. .......... 136/244

FOREIGN PATENT DOCUMENTS

| | | |
|---|---|---|
| JP | 2001318159 A | 11/2001 |
| JP | 2003133575 A | 5/2003 |
| KR | 10-0539491 A | 1/2005 |

\* cited by examiner

MULTI-ENERGY RADIATION DETECTORS AND METHODS OF MANUFACTURING THE SAME

CROSS-REFERENCE TO RELATED APPLICATION(S)

This application claims priority from Korean Patent Application No. 10-2011-0145018, filed on Dec. 28, 2011, in the Korean Intellectual Property Office (KIPO), the entire contents of which are incorporated herein by reference.

BACKGROUND

1. Field

Example embodiments relate to multi-energy radiation detectors capable of detecting radiation of different energy bands from each other and/or performing imaging processes. Example embodiments also relate to methods of manufacturing multi-energy radiation detectors.

2. Description of Related Art

Radiations such as X-rays or γ-rays (gamma-rays) are highly transmissive, and thus inside of an object may be observed by using the radiation. Due to the above property, radiation has important uses in fields such as non-destructive inspection and medical treatment. Transmission amounts of radiation may vary depending on the density or densities of the object, and the inside of the object may be imaged by measuring difference between the transmission amounts.

Many radiation imaging systems are used regardless of the energy of radiation irradiated to a detector. However, if radiation images of different energy bands are separately obtained and imaging processes are performed, objects having different degrees of absorption, reflection, and refraction of the radiation may be distinguished from each other. Tissues of different components, such as a general tissue and cancer tissue or hard tissue and soft tissue, may be distinguished from each other and may be imaged by using a multi-energy radiation imaging technology that is capable of obtaining images of different energy bands. In order to perform the multi-energy radiation imaging, X-rays of different energies may be used with a filter in an X-ray source or a photon counting method may be used in a detector. However, according to methods of using the filter on the X-ray source, X-rays have to be irradiated a plurality of times to the same object, and thus the image may be distorted due to fine movements of the object, and radiation amounts of the object may be increased. In addition, according to the photon counting method, a complex digital/analog circuit is necessary, and thus it is difficult to obtain a large-sized detector.

SUMMARY

Example embodiments may provide multi-energy radiation detectors capable of detecting radiations of different energy bands from each other to perform imaging processes.

Example embodiments may provide methods of manufacturing multi-energy radiation detectors.

According to example embodiments, a multi-energy radiation detector may comprise an array substrate including a plurality of unit circuits; and/or a photoelectric conversion layer on the array substrate. The photoelectric conversion layer may include a plurality of regions having thicknesses different from each other.

According to example embodiments, the photoelectric conversion layer may further include a first region that is relatively thin and a second region that is relatively thick.

According to example embodiments, the first region may have a thickness greater than or equal to 30 μm and less than or equal to 200 μm, and/or the second region may have a thickness greater than or equal to 300 μm and less than or equal to 1,000 μm.

According to example embodiments, a radiation of a first energy band may be detected by the first region, a radiation of a second energy band may be detected by the second region, and/or the first energy band may be different from the second energy band.

According to example embodiments, an energy of the first energy band may be less than an energy of the second energy band.

According to example embodiments, an energy of the first energy band may be greater than or equal to 10 keV and less than or equal to 50 keV.

According to example embodiments, an energy of the second energy band may be greater than or equal to 60 keV to and less than or equal 120 keV.

According to example embodiments, the photoelectric conversion layer may be formed using one or more of $HgI_2$, $PbI_2$, CdTe, CdZnTe, PbO, and $PbO_2$.

According to example embodiments, the multi-energy radiation detector may be an X-ray detector or a gamma-ray detector.

According to example embodiments, the unit circuits may include a thin film transistor (TFT) device or a complementary metal oxide semiconductor (CMOS) device.

According to example embodiments, the plurality of regions having thicknesses different from each other may be included in one pixel.

According to example embodiments, the plurality of regions having thicknesses different from each other may be included in pixels different from each other.

According to example embodiments, a multi-energy radiation detector may include a substrate; a plurality of unit circuits arranged on the substrate in a matrix form; a first photoelectric conversion layer on the unit circuits located on odd-numbered lines; and/or a second photoelectric conversion layer on the unit circuits located on even-numbered lines. Each of the plurality of unit circuits may include a switching device and a capacitor, the first photoelectric conversion layer may have a first thickness, and/or the second photoelectric conversion layer may have a second thickness.

According to example embodiments, the first thickness may be less than the second thickness.

According to example embodiments, the first thickness may be greater than or equal to 30 μm and less than or equal to 200 μm, and/or the second thickness may be greater than or equal to 300 μm and less than or equal to 1,000 μm.

According to example embodiments, a radiation of a first energy band may be detected by the first photoelectric conversion layer, radiation of a second energy band may be detected by the second photoelectric conversion layer, and/or the first energy band may be different from the second energy band.

According to example embodiments, an energy of the first energy band may be less than an energy of the second energy band.

According to example embodiments, an energy of the first energy band may be greater than or equal to 10 keV and less than or equal to 50 keV.

According to example embodiments, an energy of the second energy band may be greater than or equal to 60 keV and less than or equal to 120 keV.

According to example embodiments, the first photoelectric conversion layer may be formed using one or more of $HgI_2$, $PbI_2$, CdTe, CdZnTe, PbO, and $PbO_2$, and/or the second photoelectric conversion layer may be formed using one or more of $HgI_2$, $PbI_2$, CdTe, CdZnTe, PbO, and $PbO_2$.

According to example embodiments, the multi-energy radiation detector may be an X-ray detector or a gamma-ray detector.

According to example embodiments, a multi-energy radiation detector may include an array substrate; and/or a photoelectric conversion layer on the array substrate. The photoelectric conversion layer may include a plurality of first regions having a first thickness, and/or the photoelectric conversion layer may include a plurality of second regions having a second thickness.

According to example embodiments, a pixel of the multi-energy radiation detector may include one of the plurality of first regions or one of the plurality of second regions, but not both one of the plurality of first regions and one of the plurality of second regions.

According to example embodiments, the one of the plurality of first regions may include a first unit circuit or the one of the plurality of second regions may include a second unit circuit.

According to example embodiments, the first unit circuit may include a thin film transistor (TFT) device or a complementary metal oxide semiconductor (CMOS) device or the second unit circuit may include the TFT device or the CMOS device.

According to example embodiments, a pixel of the multi-energy radiation detector may include both one of the plurality of first regions and one of the plurality of second regions.

According to example embodiments, the one of the plurality of first regions may include a first unit circuit, and/or the one of the plurality of second regions may include a second unit circuit.

According to example embodiments, the first unit circuit may include a first thin film transistor (TFT) device or a first complementary metal oxide semiconductor (CMOS) device, and/or the second unit circuit may include a second TFT device or a second CMOS device.

According to example embodiments, a pixel of the multi-energy radiation detector may include one or more of the plurality of first regions and one or more of the plurality of second regions.

According to example embodiments, a method of manufacturing a multi-energy radiation detector may include forming a gate electrode and a first electrode by forming and patterning a first metal layer on a substrate; forming an insulating layer on the gate electrode and the first electrode; forming a channel layer by forming and patterning a semiconductor layer on the insulating layer; forming a source electrode, a drain electrode, and a second electrode by forming and patterning a second metal layer on the channel layer; forming a passivation layer to cover the source electrode, the drain electrode, and the second electrode; forming a first photoelectric conversion layer having a first thickness on the passivation layer; and/or forming a second photoelectric conversion layer having a second thickness on a part of the first photoelectric conversion layer by using a mask.

According to example embodiments, the first photoelectric conversion layer may be formed using one or more of $HgI_2$, $PbI_2$, CdTe, CdZnTe, PbO, and $PbO_2$, and/or the second photoelectric conversion layer may be formed using one or more of $HgI_2$, $PbI_2$, CdTe, CdZnTe, PbO, and $PbO_2$.

According to example embodiments, the first thickness may be greater than or equal to 30 μm and less than or equal to 200 μm, and/or the second thickness may be greater than or equal to 300 μm and less than or equal to 1,000 μm.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 1:
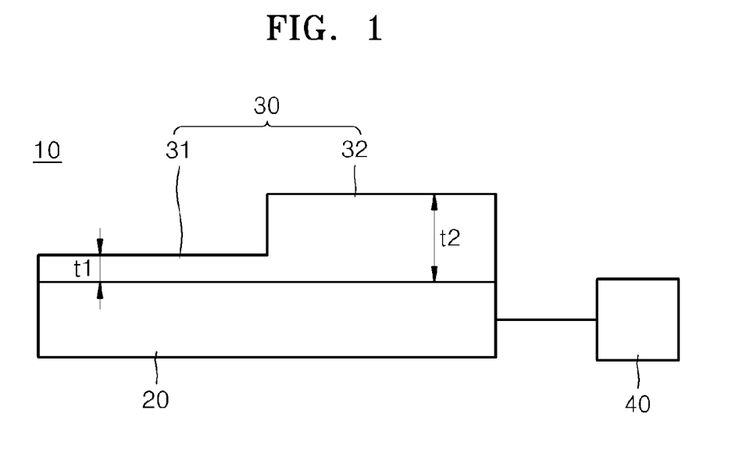
FIG. 1 is a schematic cross-sectional view of a multi-energy radiation detector according to example embodiments.

FIG. 1 is a schematic cross-sectional view of a multi-energy radiation detector 10 according to example embodiments.

Referring to FIG. 1, the multi-energy radiation detector 10 includes an array substrate 20 and a photoelectric conversion layer 30 on the array substrate 20. The array substrate 20 may include a plurality of unit circuits (not shown) connected to the photoelectric conversion layer 30. The unit circuit may include a thin film transistor (TFT) device or a complementary metal oxide semiconductor (CMOS) device. The photoelectric conversion layer 30 may include a plurality of regions having different thickness from each other. FIG. 1 shows a unit region including a plurality of regions having different thickness, and the unit regions may be arranged in a matrix form. For example, the unit region may form a pixel of the multi-energy radiation detector. Otherwise, each of the plurality of regions having different thicknesses may form different pixels.

Referring to FIG. 1, the photoelectric conversion layer 30 may include, for example, a first region 31 having a first thickness t1, and a second region 32 having a second thickness t2. Here, the first thickness t1 may be less than the second thickness t2.

When radiation, for example, an X-ray or a γ-ray (gamma-ray) is incident to the photoelectric conversion layer 30, electric charges may be generated in the photoelectric conversion layer 30, and an electric current may flow due to movements of the electric charges. A generation amount of the electric charges may vary depending on an intensity of the radiation absorbed by the photoelectric conversion layer 30. In example embodiments, a radiation absorption ratio of the photoelectric conversion layer may vary depending on a thickness of the photoelectric conversion layer. For example, relatively large amount of radiation of a first energy band is detected by the first region 31 having the thinner photoelectric conversion layer, and relatively large amount of radiation of a second energy band may be detected by the second region 32 having the thicker photoelectric conversion layer. For example, the first energy band may be a low energy band and the second energy band may be a high energy band.

The multi-energy radiation detector 10 of example embodiments may further include a signal processor 40 connected to the array substrate 20. The signal processor 40 may perform an imaging operation by using a signal output from the array substrate 20. The multi-energy radiation detector 10 of example embodiments may obtain an image formed by the low energy band radiation from the first region 31, and an image formed by the high energy band radiation from the second region 32 at the same time. The signal processor 40 may be separate from the array substrate 20; however, the signal processor 40 may be included in the array substrate 20 if necessary. Structures of the signal processor 40 are well known in the art, and thus detailed descriptions about the signal processor 40 are not provided here.

Figure 2:
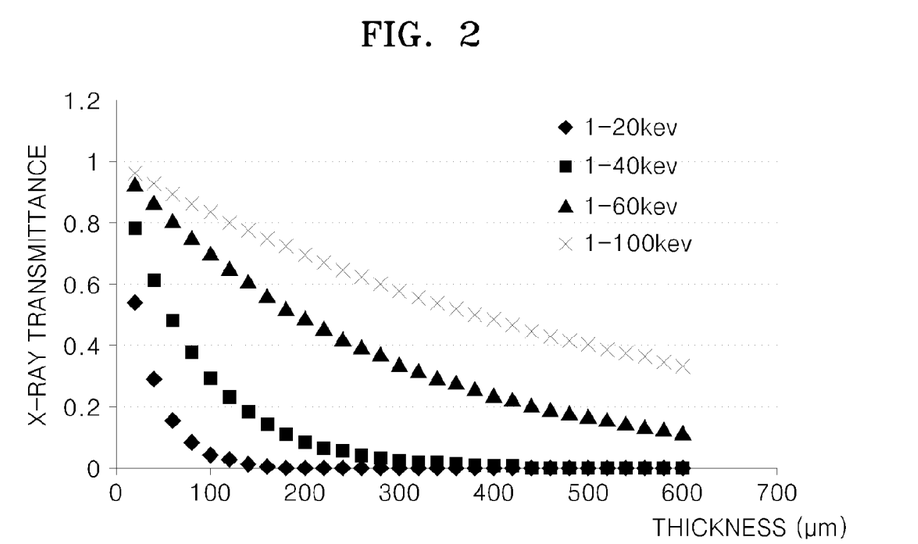
FIG. 2 is a graph showing transmittance of radiations in different energy bands according to a thickness of a photoelectric conversion layer adopted in the multi-energy radiation detector of FIG. 1.

Next, principles of detecting radiations of different energy bands according to the thickness of the photoelectric conversion layer 30 will be described. FIG. 2 is a graph showing variations in transmittance of X-rays according to a thickness of the photoelectric conversion layer formed of HgI2, where the X-rays have different energy bands. Referring to FIG. 2, when the thickness of the photoelectric conversion layer is about 100 μm, about 10% or less X-rays of a 20 KeV energy band may be transmitted, and about 60% to 80% X-rays of a 60 KeV energy band may be transmitted. If the X-ray transmittance of the photoelectric conversion layer is high, the X-ray absorption ratio of the photoelectric conversion layer is low and a photoelectric conversion ratio may be low. Meanwhile, if the X-ray transmittance of the photoelectric conversion layer is low, the X-ray absorption ratio is high and the photoelectric conversion ratio may be high. Therefore, in the photoelectric conversion layer having a thickness of about 100 μm, the X-rays of the 20 keV energy band may be detected more than the X-rays of the 60 keV energy band.

On the other hand, when the photoelectric conversion layer has a thickness of about 400 μm, about 10% or less X-rays of the 20 keV energy band is transmitted and about 20% of X-rays of the 60 keV energy band may be transmitted. Here, the absorption ratio of the 20 keV energy band X-rays may be greater than that of the X-rays of the 60 keV energy band. However, the difference between the absorption ratio may be ignorable and an amount of electric charges generated by the X-rays of the 20 keV energy band is much less than an amount of electric charges generated by the X-rays of the 60 keV energy band, and thus the X-rays of the 60 keV energy band may be detected relatively more than the X-rays of the 20 keV energy band in the photoelectric conversion layer having the thickness of about 400 μm.

As described above, radiation of multi-energy bands may be detected by one detector according to the above described phenomenon, that is, varying of the energy band of the detected radiation according to the thickness of the photoelectric conversion layer. For example, the first region 31 of the photoelectric conversion layer may have a thickness ranging from 30 μm to 200 μm and the second region 32 of the photoelectric conversion layer may have a thickness ranging from 300 μm to 1,000 μm. In the first region 31, the radiation of the first energy band is detected, and in the second region, the radiation of the second energy band that is different from the first energy band may be detected. The first energy band may be lower than the second energy band. For example, the first energy band may be within a range of 10 keV to 50 keV, and the second energy band may be within a range of 60 keV to 120 keV. As described above, the X-rays of the high energy band and the X-rays of the low energy band may be separately detected according to the thickness of the photoelectric conversion layer. Therefore, the X-ray image of the high energy band and the X-ray image of the low energy band may be obtained at the same time. For example, the X-ray image of the high energy band may be an image that is highly sensitive to a cancer tissue or a hard tissue, and the X-ray image of the low energy band may be an image that is highly sensitive to a normal tissue or a soft tissue.

Processes of obtaining images of an examined portion by using the multi-energy radiation detector are as follows. When a radiation is irradiated onto the examined portion, the radiation transmitting through the examined portion is incident to the multi-energy radiation detector. According to a tissue of the examined portion, for example, according to whether the examined portion is a hard tissue or a soft tissue, an energy band of the transmitted radiation may vary. For example, the energy band of the radiation transmitting through the hard tissue may be higher than that of the radiation transmitting through the soft tissue. The radiation of the high energy band and the radiation of the low energy band, which have transmitted through the examined portion, are incident to the multi-energy band radiation detector. The multi-energy radiation detector of example embodiments may include a region in which a detection rate of the radiation of low energy band is high and a region in which a detection rate of the radiation of high energy band is high according to the thickness of the photoelectric conversion layer. Therefore, an image of the soft tissue or the normal tissue may be obtained from the region where the detection rate of the radiation of low energy band is high, and an image of the hard tissue or the cancer tissue may be obtained from the region where the detection rate of the radiation of high energy band is high. As described above, according to the multi-energy radiation detector of example embodiments, there is no need to irradiate the radiation onto the examined portion a plurality of times, and the radiations of multi-energy bands may be detected at the same time.

Figure 3:
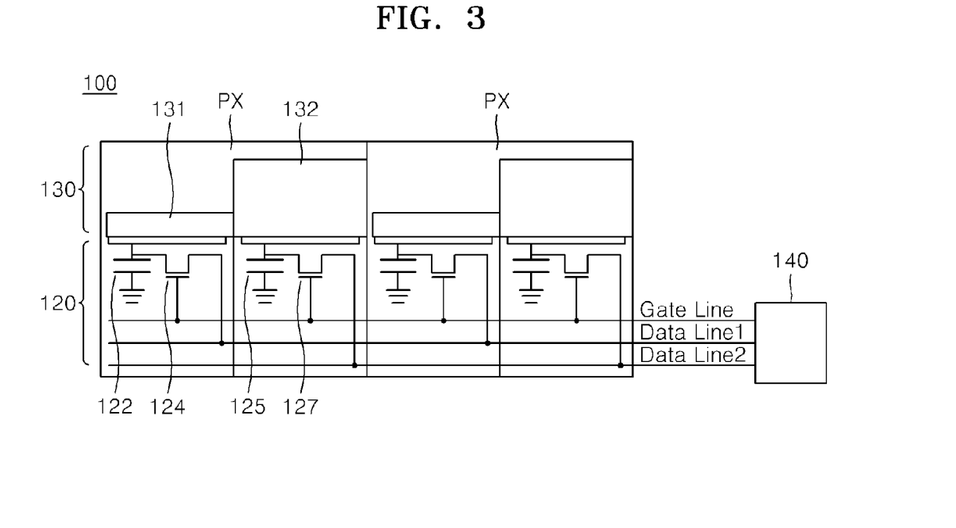
FIG. 3 is a diagram showing an example of disposing a first region and a second region of a photoelectric conversion layer of a multi-energy radiation detector in one pixel.

FIG. 3 is a multi-energy radiation detector 100 according to example embodiments. The multi-energy radiation detector 100 includes an array substrate 120 including a unit circuit, and a photoelectric conversion layer 130 on the array substrate 120. In the photoelectric conversion layer 130, a first region 131 having a first thickness and a second region 132 having a second thickness that is greater than the first thickness are alternately arranged. The multi-energy radiation detector 100 includes a plurality of pixels PX, and each of the pixels PX may include the first region 131 and the second region 132.

The array substrate 120 may include unit circuits each corresponding to the first regions 131 and the second regions 132. Each of the unit circuits may include, for example, a capacitor, and a switching device. The switching device may be a TFT.

Referring to FIG. 3, the unit circuit corresponding to the first region 131 may include a first capacitor 122 and a first TFT 124. The first TFT 124 may include a gate electrode, a source electrode, and a drain electrode. The gate electrode of the first TFT 124 is connected to a gate line (Gate Line), and the source electrode of the first TFT 124 may be connected to a first data line (Data Line 1). The unit circuit corresponding to the second region 132 may include a second capacitor 125 and a second TFT 127. A gate electrode of the second TFT 127 may be connected to the gate line (Gate Line), and a source electrode of the second TFT 127 may be connected to a second data line (Data Line 2). Drain electrodes of the first TFT 124 and the second TFT 127 may be respectively connected to the corresponding first capacitor 122 and the second capacitor 125.

When radiation is incident to the photoelectric conversion layer 130, electric charges generated from the radiation of the first energy band, which is detected more from the first region 131 of the photoelectric conversion layer 130 than the second region 132, are stored in the first capacitor 122. When the first TFT 124 is turned on via the gate line (Gate Line), the electric charges stored in the first capacitor 122 may be moved to a signal processor 140 through the first data line (Data Line 1). At the same time, when the radiation is incident to the photoelectric conversion layer 130, the electric charges generated from the radiation of the second energy band, which is detected more from the second region 132 of the photoelectric conversion layer 130 than the first region 131, are stored in the second capacitor 125. When the second TFT 127 is turned on via the gate line (Gate Line), the electric charges stored in the second capacitor 125 may be moved to the signal processor 140 through the second data line (Data Line 2).

The signal processor 140 may generate a first image by using a signal input through the first data line (Data Line 1), and may generate a second image by using a signal input through the second data line (Data Line 2). Thus, the multi-energy radiation detector that may obtain the images by detecting the radiations of different energy bands may be realized without using a complex circuit and irradiating the radiation a plurality of times onto the examined portion.

Figure 4:
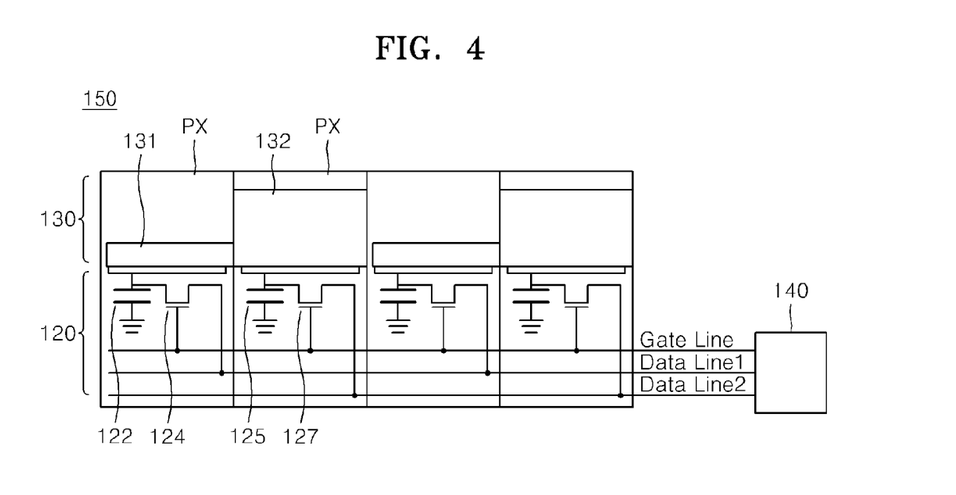
FIG. 4 is a diagram showing an example of disposing the first region and the second region of the photoelectric conversion layer of the multi-energy radiation detector in different pixels.

The multi-energy radiation detector 150 shown in FIG. 4 has the substantially same components as those of FIG. 3, except for that the first region 131 and the second region 132 having different thicknesses from each other form different pixels. For example, when the radiation detector has a n×m pixel-array structure, the image formed by the radiation of the first energy band and the image formed by the radiation of the second energy band may be displayed without degrading resolution thereof in the radiation detector of FIG. 3. On the other hand, in the radiation detector shown in FIG. 4, an image formed by the radiation of the first energy band and an image formed by the radiation of the second energy band may be displayed in ½ resolution, respectively. However, if the radiation detectors shown in FIG. 3 and FIG. 4 are the same as each other, the number of pixels of the radiation detector shown in FIG. 4 is greater than that of the radiation detector shown in FIG. 3. Accordingly, one of the structures shown in FIG. 3 and FIG. 4 may be selected according to the size and the number of pixels.

Figure 5:
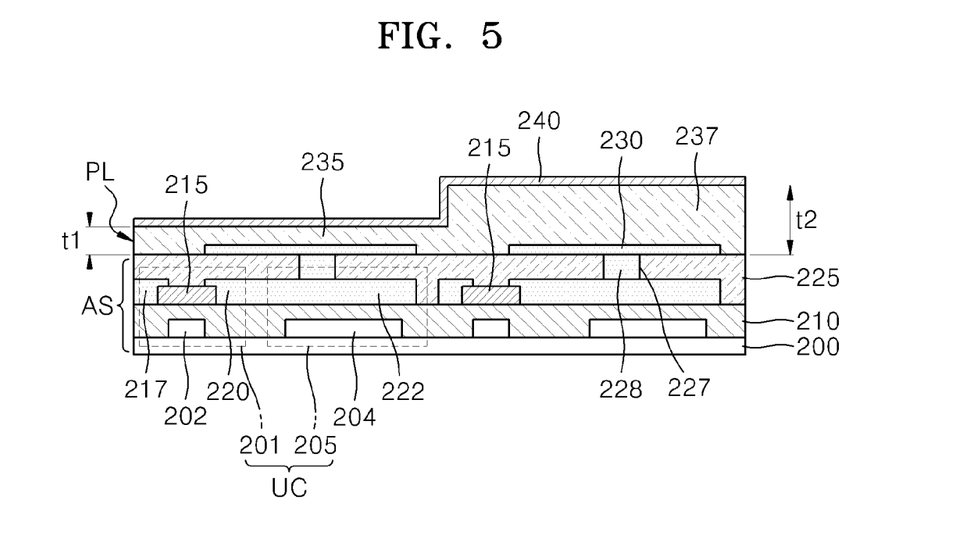
FIG. 5 is a cross-sectional view of a multi-energy radiation detector according to example embodiments.

FIG. 5 is a cross-sectional view of a multi-energy radiation detector according to example embodiments.

Referring to FIG. 5, the multi-energy radiation detector of example embodiments includes an array substrate AS, and a photoelectric conversion layer PL on the array substrate AS. The array substrate AS may include a substrate 200, and unit circuits UC in every unit array on the substrate 200. The unit circuit UC detects an electric signal from the photoelectric conversion layer PL, and may include, for example, a switching device 201 and a capacitor 205. The switching device 201 may be a TFT. The switching device 201 may include a gate electrode 202 on the substrate 200, an insulating layer 210 on the gate electrode 202, and a channel layer 215 on the insulating layer 210. The gate electrode 202 may be connected to a gate line (Gate Line) (refer to FIG. 3), and may be formed of, for example, aluminum (Al) or an alloy of Al. The insulating layer 210 may be formed as an oxide layer or a nitride layer. The insulating layer 210 may be formed of, for example, silicon nitride ($SiN_x$), silicon oxide ($SiO_x$), or $SiON_x$. Otherwise, the insulating layer 210 may be formed of $Al2O3$ or $HfO2$. The gate electrode 202 may be face the channel layer 215, and a source electrode 217 and a drain electrode 220 may be on both sides of the channel layer 215. The channel layer 215 may be formed of amorphous silicon (a-Si), polysilicon (Poly-Si), or an oxide semiconductor. The oxide semiconductor may be a ZnO-based material doped with Ga, In, or Hf. The source electrode 217 and the drain electrode 220 may be formed of molybdenum (Mo), an alloy of Mo-tungsten (MoW), chromium (Cr), tantalum (Ta), or titanium (Ti).

The capacitor 205 may include a first electrode 204 on the substrate 200, the insulating layer 210 on the first electrode 204, and a second electrode 222 on the insulating layer 210. The first electrode 204 and the gate electrode 202 may be formed of the same material. The drain electrode 220 may be integrally formed with the second electrode 222 such that the drain electrode 220 and the second electrode 222 may be electrically connected to each other.

The photoelectric conversion layer PL may include a plurality of unit regions having thicknesses different from each other. The photoelectric conversion layer PL may be formed of at least one material selected from the group consisting of HgI2, PbI2, CdTe, CdZnTe, PbO, and PbO2. For example, the photoelectric conversion layer PL may include a first photoelectric conversion layer 235 of the first region having a first thickness t1 and a second photoelectric conversion layer 237 of the second region having a second thickness t2. The first thickness t1 may be less than the second thickness t2. The unit circuit UC may be in every unit region of the photoelectric conversion layer PL. Here, a plurality of unit regions having thicknesses different from each other may be included in one pixel. Otherwise, the plurality of regions having thicknesses different from each other may be in different pixels.

A lower electrode 230 and an upper electrode 240 may be respectively on a lower portion and an upper portion of the first photoelectric conversion layer 235. In addition, the lower electrode 230 and the upper electrode 240 may be respectively on a lower portion and an upper portion of the second photoelectric conversion layer 237. The lower electrode 230 may be in each of the unit regions, and the upper electrode 240 may be formed as a common electrode. The lower electrode 230 may be electrically connected to the second electrode 222 via a conductive material 228 filled in a hole 227. The lower electrode 230, the first photoelectric conversion layer 235, and the upper electrode 240 may configure a first photo diode. In addition, the lower electrode 230, the second photoelectric conversion layer 237, and the upper electrode 240 may configure a second photo diode.

Operations of the multi-energy radiation detector of FIG. 5 are described as follows. When the radiation is incident to the radiation detector, radiations of different energy bands may be detected from the first photoelectric conversion layer 235 and the second photoelectric conversion layer 237 having different thicknesses from each other. For example, relatively large amount of the radiation of the first energy band may be detected from the first photoelectric conversion layer 235, and relatively large amount of the radiation of the second energy band may be detected from the second photoelectric conversion layer 237. Electric charges generated by the radiation of the first energy band are stored in the capacitor 205 connected to the first photoelectric conversion layer 235, and electric charges generated by the radiation of the second energy band are stored in the capacitor 205 connected to the second photoelectric conversion layer 237. When the switching device 201 is turned on through the gate line (Gate Line) (refer to FIG. 3), the electric charges stored in the capacitor 205 may be moved to the signal processor (refer to FIG. 3) through the data line (Data Line 1 or Data Line 2) corresponding thereto. A first image of the first energy band may be generated by using the signal from the first photoelectric conversion layer 235, and a second image of the second energy band may be generated by using the signal from the second photoelectric conversion layer 237.

FIG. 5 only shows the structure of one set including the first photoelectric conversion layer 235 and the second photoelectric conversion layer 237, and the set structure may be arranged in a matrix. That is, a plurality of unit circuits each including the switching device and the capacitor may be arranged in a matrix on the substrate 200. In addition, the first photoelectric conversion layer 235 having the first thickness is arranged on the unit circuits located in odd-numbered lines, and the second photoelectric conversion layer 237 having the second thickness may be arranged on the unit circuits located on even-numbered lines.

The structure shown in FIG. 5 is just an example showing the detailed structure of the radiation detector according to example embodiments, and the structure may be modified variously.

FIGS. 6A through 6G are diagrams illustrating a method of manufacturing a multi-energy radiation detector according to example embodiments.

Figure 6A:
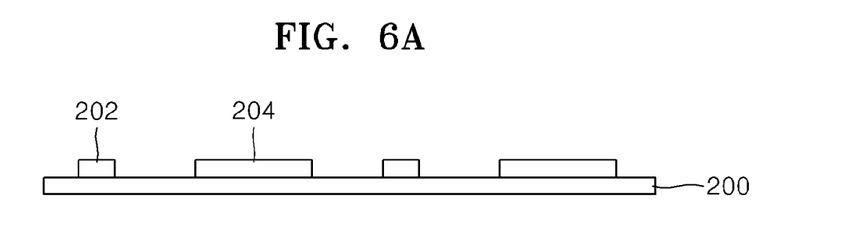
FIGS. 6A through 6G are cross-sectional views illustrating a method of manufacturing a multi-energy radiation detector according to example embodiments.
Figure 6B:
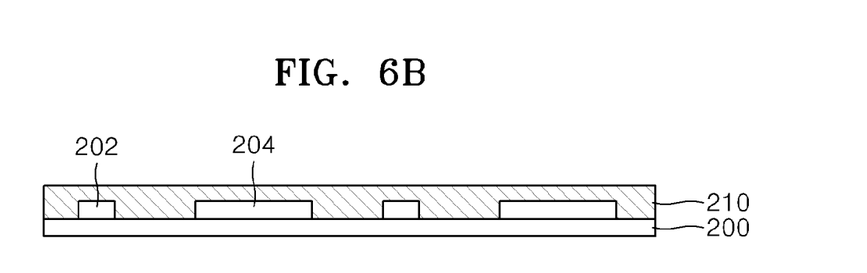

Referring to FIG. 6A, a first metal layer is deposited on the substrate 200, and the first metal layer is patterned to form the gate electrode 202 and the first electrode 204. The substrate 200 may be a glass substrate or a wafer. Referring to FIG. 6B, the insulating layer 210 is formed on the gate electrode 202 and the first electrode 204. The insulating layer 210 may be formed as, for example, an oxide layer, a nitride layer, or a dielectric substance having a high relative permittivity. The oxide layer may be an Si oxide layer such as $SiN_x$, $SiO2$, or $SiON_x$. The dielectric substance may be, for example, $Al2O3$ or $HfO2$. The insulating layer 210 may correspond to the gate insulating layer of the TFT and the dielectric substance of the capacitor.

Figure 6C:
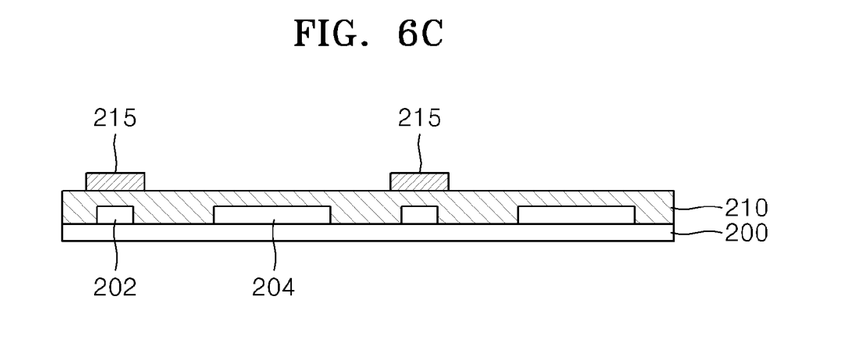

Referring to FIG. 6C, a semiconductor layer is formed on the insulating layer 210, and then is patterned to form the channel layer 215. The channel layer 215 may be formed of, for example, one of a-Si, Poly-Si, and an oxide semiconductor. The oxide semiconductor may be, for example, a ZnO-based material doped with Ga, In, or Hf.

Figure 6D:
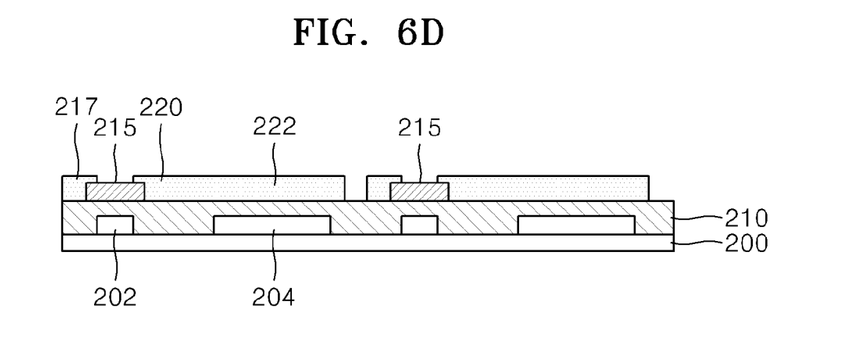
Figure 6E:
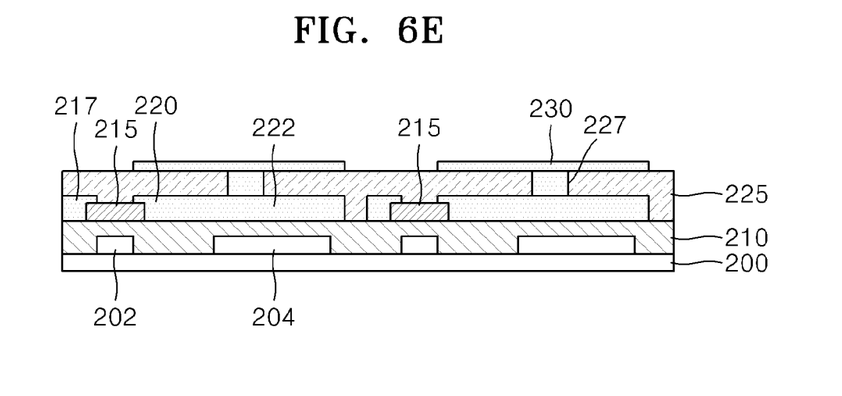

Referring to FIG. 6D, a second metal layer is formed on the channel layer 215 and patterned to form the source electrode 217, the drain electrode 220, and the second electrode 222. The source electrode 217 and the drain electrode 220 are separated from each other, and the channel layer 215 may be exposed between the source electrode 217 and the drain electrode 220. The second electrode 222 may be used as an electrode of the capacitor. Here, the drain electrode 220 and the second electrode 222 may be connected to each other. Referring to FIG. 6E, a passivation layer 225 is formed to cover the source electrode 217, the drain electrode 220, and the second electrode 222, and the hole 227 is formed in the passivation layer 225 to expose a part of the second electrode 222. In addition, a third metal layer is formed on the passivation layer 225 and patterned to form the lower electrode 230. The third metal layer is filled in the hole 227 such that the lower electrode 230 may be connected to the second electrode 222 via the hole 227.

Figure 6F:
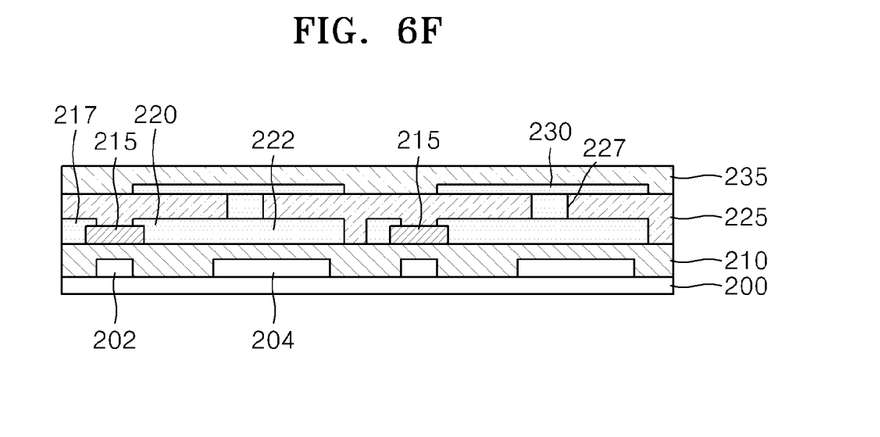
Figure 6G:
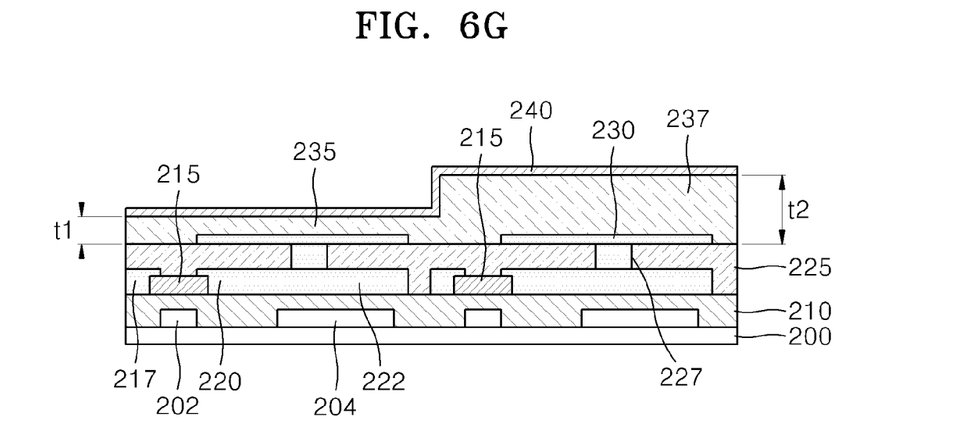

Referring to FIG. 6F, the first photoelectric conversion layer 235 having the first thickness t1 is formed on the lower electrode 230. The first photoelectric conversion layer 235 may be formed by a vacuum deposition method or a screen printing method. Next, as shown in FIG. 6G, the second photoelectric conversion layer 237 may be formed by using a mask. Here, the second photoelectric conversion layer 237 refers to the region including the first photoelectric conversion layer 235 formed under the second photoelectric conversion layer 237. In addition, the second photoelectric conversion layer 237 has the second thickness t2. The first and second photoelectric conversion layers 235 and 237 may be formed of the same material. For example, the first and second photoelectric conversion layers 235 and 237 may be formed of at least one material selected from the group consisting of HgI2, PbI2, CdTe, CdZnTe, PbO, and PbO2. Next, the upper electrode 240 is formed on the first and second photoelectric conversion layers 235 and 237.

The gate electrode 202, the channel layer 215, the source electrode 217, and the drain electrode 220 may configure a TFT. In addition, the first electrode 204, the second electrode 222 facing the first electrode 204, and the insulating layer 210 between the first and second electrodes 204 and 222 may configure a capacitor. In addition, the layer including the unit circuit such as the TFT and the capacitor may be an example of the array substrate.

As described above, the multi-energy radiation detector according to example embodiments may be manufactured through simple semiconductor manufacturing processes.

The multi-energy radiation detector according to example embodiments is a flat panel detector that may detect two or more different energy bands, and the photoelectric conversion layers having different thicknesses are included in one array or in one pixel. Even if the photoelectric conversion layer is formed of the same material, the absorption ratios of the radiations of the different energy bands are different from each other according to the thickness. Thus, the absorption ratio may vary depending on the energy bands of the radiations in the photoelectric conversion layer having different thicknesses, and thus the images formed by the radiations of different energy bands may be obtained from one array or one pixel.

While example embodiments have been particularly shown and described, it will be understood by those of ordinary skill in the art that various changes in form and details may be made therein without departing from the spirit and scope of the present invention as defined by the following claims.

What is claimed is:

1. A multi-energy radiation detector, comprising:
an array substrate including a plurality of unit circuits; and
a photoelectric conversion layer on the array substrate;
wherein the photoelectric conversion layer includes a plurality of regions having thicknesses different from each other, and
wherein the plurality of regions do not overlap each other in a thickness direction.

2. The multi-energy radiation detector of claim 1, wherein the photoelectric conversion layer further includes:
a first region that is relatively thin; and
a second region that is relatively thick.

3. The multi-energy radiation detector of claim 2, wherein the first region has a thickness greater than or equal to 30 μm and less than or equal to 200 μm, and
wherein the second region has a thickness greater than or equal to 300 μm and less than or equal to 1,000 μm.

4. The multi-energy radiation detector of claim 2, wherein a radiation of a first energy band is detected by the first region,
wherein a radiation of a second energy band is detected by the second region, and
wherein the first energy band is different from the second energy band.

5. The multi-energy radiation detector of claim 4, wherein an energy of the first energy band is less than an energy of the second energy band.

6. The multi-energy radiation detector of claim 4, wherein an energy of the first energy band is greater than or equal to 10 keV and less than or equal to 50 keV.

7. The multi-energy radiation detector of claim 4, wherein an energy of the second energy band is greater than or equal to 60 keV to and less than or equal 120 keV.

8. The multi-energy radiation detector of claim 1, wherein the photoelectric conversion layer is formed using one or more of $HgI_2$, $PbI_2$, CdTe, CdZnTe, PbO, and $PbO_2$.

9. The multi-energy radiation detector of claim 1, wherein the multi-energy radiation detector is an X-ray detector or a gamma-ray detector.

10. The multi-energy radiation detector of claim 1, wherein the unit circuits include a thin film transistor (TFT) device or a complementary metal oxide semiconductor (CMOS) device.

11. The multi-energy radiation detector of claim 1, wherein the plurality of regions having thicknesses different from each other are included in one pixel.

12. The multi-energy radiation detector of claim 1, wherein the plurality of regions having thicknesses different from each other are included in pixels different from each other.

13. The multi-energy radiation detector of claim 1, wherein the plurality of regions of the photoelectric conversion layer includes a first region and a second region, and
wherein the first and second regions are on a same side of the array substrate.

14. The multi-energy radiation detector of claim 1, wherein the plurality of regions of the photoelectric conversion layer includes a first region and a second region, and
wherein the first and second regions are side-by-side.

15. A multi-energy radiation detector, comprising:
a substrate;
a plurality of unit circuits arranged on the substrate in a matrix form;
a first photoelectric conversion layer on the unit circuits located on odd-numbered lines; and
a second photoelectric conversion layer on the unit circuits located on even-numbered lines;
wherein each of the plurality of unit circuits includes a switching device and a capacitor,
wherein the first photoelectric conversion layer has a first thickness,
wherein the second photoelectric conversion layer has a second thickness, and
wherein the first photoelectric conversion layer does not overlap the second photoelectric conversion layer in a thickness direction.

16. The multi-energy radiation detector of claim 15, wherein the first thickness is less than the second thickness.

17. The multi-energy radiation detector of claim 15, wherein the first thickness is greater than or equal to 30 μm and less than or equal to 200 μm, and
wherein the second thickness is greater than or equal to 300 μm and less than or equal to 1,000 μm.

18. The multi-energy radiation detector of claim 15, wherein a radiation of a first energy band is detected by the first photoelectric conversion layer,
wherein a radiation of a second energy band is detected by the second photoelectric conversion layer, and
wherein the first energy band is different from the second energy band.

19. The multi-energy radiation detector of claim 18, wherein an energy of the first energy band is less than an energy of the second energy band.

20. The multi-energy radiation detector of claim 18, wherein an energy of the first energy band is greater than or equal to 10 keV and less than or equal to 50 keV.

21. The multi-energy radiation detector of claim 18, wherein an energy of the second energy band is greater than or equal to 60 keV and less than or equal to 120 keV.

22. The multi-energy radiation detector of claim 15, wherein the first photoelectric conversion layer is formed using one or more of $HgI_2$, $PbI_2$, CdTe, CdZnTe, PbO, and $PbO_2$, and wherein the second photoelectric conversion layer is formed using one or more of $HgI_2$, $PbI_2$, CdTe, CdZnTe, PbO, and $PbO_2$.

23. The multi-energy radiation detector of claim 15, wherein the multi-energy radiation detector is an X-ray detector or a gamma-ray detector.

24. The multi-energy radiation detector of claim 15, wherein the first and second photoelectric conversion layers are on a same side of the substrate.

25. The multi-energy radiation detector of claim 15, wherein the first and second photoelectric conversion layers are side-by-side.

\* \* \* \* \*